United States Patent Office 3,278,304

Patented Oct. 11, 1966

3,278,304

PHOTOPOLYMERIZATION OF ETHYLENICALLY UNSATURATED ORGANIC COMPOSITIONS

André Jan Conix, Antwerp, and Urbain Leopold Laridon, Wilrijk-Antwerp, Belgium, assignors to Gevaert Photo-Producten N.V., Mortsel-Antwerp, Belgium, a company of Belgium No Drawing. Filed Apr. 22, 1963, Ser. No. 274,778
17 Claims. (Cl. 96—35.1)

The present invention relates to the photopolymerization of ethylenically unsaturated organic compositions and to polymers obtained therefrom.

The photopolymerization of ethylenically unsaturated organic compositions can be initiated by exposure to high intensity radiation such as ultra violet rays. Methylacrylate, for instance, on long standing in sun light is transformed into a transparent mass (cf. Ellis: The Chemistry of Synthetic Resins, vol. II (1935) page 1072). Polymerization, however, by the use of light alone, proceeds at a very much slower rate when compared to polymerization brought about by a radical generating catalyst or by heat. Moreover, the use of light alone, unaided by other agents, requires very long exposure times in order to polymerize the monomer sufficiently. Furthermore, the low rate of polymerization necessitates the use of extremely intense radiations such as those obtained from high intensity carbon arcs.

A lot of photopolymerization initiators which, under the influence of actinic light, increase the photopolymerization rate, have already been described. A survey of such photoplymerization initiators has been given by G. Delzenne in ('Industrie Chimique Belge, 24 (1959) 739–764."

An object of the present invention is to provide a new class of photopolymerization initiators activatable by actinic light.

Another object of the present invention is to provide a new class of photopolymerization initiators which require very low rates of exposition to actinic light.

A further object is to provide a process whereby the photopolymerization of ethylenically unsaturated organic compositions can be carried out at a practicable rate by visible light as well as by ultraviolet light.

Other objects will appear hereinafter.

According to the present invention the photopolymerization of ethylenically unsaturated organic compositions is improved by exposing said ethylenically unsaturated organic compositions to actinic light rays in the presence as a photopolymerization initiator of at least one azohydroperoxide.

The quantity of azohydroperoxide to be used as photopolymerization initiator will of course be dependent upon many variables including the particular azohydroperoxide, the wave length of light employed, the irradiation time, the monomer or monomers present, the temperature, the quantity and type of solvents present, etc. Usually the amount of azohydroperoxide photopolymerization initiator is very small, within the range of 0.01 to 5% by weight based upon the amount of monomeric material initially present. It is seldom necessary to employ more than 0.2 to 2% by weight to obtain a good polymerization rate.

The ethylenically unsaturated organic compositions may be exposed to actinic light from any source and of any type. The light source should, preferably although not necessarily, furnish an effective amount of ultraviolet radiation. Suitable sources of light include carbon arcs, mercury-vapor lamps, fluorescent lamps, argon glow lamps, photographic flood lamps and tungsten lamps. Moreover, with the azohydroperoxides of the invention, ordinary day light may also be used.

For initiating the photopolymerization by means of the photopolymerization initiators according to the invention a very strong light source is not needed. Indeed, in most of the examples described hereinafter a 80 watt Philips mercury-vapor lamp, placed at a distance of about 15 cm. of the surface to be polymerized, is used. Brighter light sources are generally not needed since at these relatively low light intensities the photoinitiating influence of the azohydroperoxides according to the invention is found to be strong enough.

The photopolymerization can be carried out by any of the well-known processes, such as bulk, emulsion, suspension and solution polymerization processes. In all of these processes, the addition of an azohydroperoxide according to the invention to polymerizable materials subjected to the action of actinic light greatly increase the rate of photopolymerization.

A suitable base or support may be coated with a solution of the ethylenically unsaturated organic composition in a suitable solvent, this solution containing dissolved or homogenously dispersed therein, a photopolymerization initiating azohydroperoxide, whereupon the solvent or solvent mixture is eliminated by known means such as evaporation, leaving a more or less thin coating of the ethylenically unsaturated organic composition upon the base or support. Thereafter the dried photopolymerizable coating is exposed to actinic light rays.

When polymerizing in solution the choice of the solvent may have a definite influence on the polymerization rate and yield.

When exposing the photopolymerizable composition to actinic light rays the polymerization does not start immediately. It is only after a short period, which among others depends on the ethylenically unsaturated organic composition, the photopolymerization initiator and the light intensity used, that the photopolymerization starts. The period necessary for obtaining a perceptible polymerizate is a measure for the efficiency of the photopolymerization initiator. In the further description and examples said period is referred to as the "inhibition period."

In some circumstances it may be desirable that the photopolymerizable composition comprises a hydrophilic or hydrophobic colloid as carrier or binding agent for the ethylenically unsaturated organic composition and the photopolymerization initiating azohydroperoxide compound. By the presence of this binding agent the properties of the light-sensitive layer are of course highly affected. The choice of the binding agent is dependent on its solubility in solvents which can also be used as solvents for the ethylenically unsaturated organic compounds and for the azohydroperoxides of the invention. Suitable binding agents are for instance poly(styrene), poly(methylmethacrylate), poly(vinylacetate), poly(vinylbutyral), partially saponified cellulose acetate and other polymers soluble in organic solvents. In some instances water-soluble polymers can be used such as gelatin, casin, starch, carboxymethyl cellulose, poly(vinylalcohol) and others. It is evident that the ratio photopolymerizable composition/binding agent also influences the photopolymerization. The larger this ratio, the higher the photopolymerization rate generally will be for one and the same ethylenically unsaturated organic composition.

If the photopolymerizable composition is water-soluble, water may be used as solvent in coating the support. On the contrary, if water-insoluble photopolymerizable compositions are used, organic solvents, mixtures of organic solvents or mixtures of organic solvents and water may be used.

When the photopolymerizable compounds are crystallizable it is found that the photopolymerization is surprisingly more effective when the photopolymerizable compounds present in the coated layer are in the crystalline state.

Azohydroperoxides suited for being applied as photopolymerization initiators are for instance:

benzylazophenylhydroperoxide,
benzylazo-β-naphthyl-hydroperoxide,
p-methoxybenzylazophenylhydroperoxide,
p-methoxybenzylazo-p-tolyl-hydroperoxide,
p-hydroxybenzylazophenylhydroperoxide,
cyclohexane-1-azophenylhydroperoxide,
1,3-diphenylpropane-2-azophenyl-2-hydroperoxide.

In addition to the above non-limiting list of azohydroperoxides there still exist whole series of azohydroperoxides suitable for being used as photopolymerization initiator provided they satisfy the definitions given in the objects of invention.

Suitable are azohydroperoxides represented by the general formula:

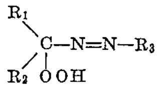

wherein each of $R_1$, $R_2$ and $R_3$ represents any organic radical which is inert to azo and hydroperoxide radicals.

Especially suitable azohydroperoxides are those corresponding to the above formula, wherein $R_1$ is a member of the group consisting of hydrogen, alkyl, aryl, aralkyl, alkaryl, alkoxy, aryloxy, hydroxyalkyl, hydroxyaryl, carboxyalkyl and derivatives, carboxyaryl and derivatives, sulfoalkyl and derivatives, sulfoaryl and derivatives and halogen;

$R_2$ is a member of the group consisting of hydrogen, alkyl, aralkyl, alkoxy, aryloxy, hydroxyalkyl, carboxyalkyl and derivatives, sulfoalkyl and derivatives, and halogen;

with the provision that $R_1$ and $R_2$ may also be linked and form together a radical selected from cycloaliphatic and heterocyclic radicals; and wherein $R_3$ is a member of the group consisting of hydrogen, alkyl, aryl, alkaryl, aralkyl, with the provision that alkyl, aryl, alkaryl and aralkyl may also be substituted by at east one of the radicals selected from —OH, —COOH and derivatives, —$SO_3H$ and derivatives, halogen, —$NO_2$ and alkoxy.

All these azohydroperoxides are manufactured according to known methods. They may among others be manufactured by oxidation of an aliphatic, cycloaliphatic, aromatic or heterocyclic ketone hydrazone or aldehyde hydrazone.

In addition to the monoazohydroperoxides described above, bis(azohydroperoxide) compounds may also be used as photopolymerization initiator.

Polymeric azohydroperoxides can also be applied. These polymeric azohydroperoxides may among others be obtained by reaction of a polymeric ketone or of a polymeric aldehyde and hydrazine, followed by oxidation.

The azohydroperoxides can be mixed with the photopolymerizable composition.

It is evident that also combinations of two or more azohydroperoxides may be applied as photopolymerization initiator in the photopolymerization of particular monomers.

The process of the invention may be applied to the photopolymerization of ethylenically unsaturated organic compositions. These compositions may comprise one or more ethylenically unsaturated polymerizable compounds such as acrylamide, methacrylamide, N-methylolacrylamide, acrylonitrile, acrylic acid, methacrylic acid, calcium acrylate, vinyl carbazole, vinyl phthalimide, etc. When two of these monomers are used in the same photopolymerizable composition or if they are mixed with other polymerizable compounds, copolymers are formed during the photopolymerization. It is further suspected that in the case where the photopolymerizable material is used together with a polymeric binding agent, graft copolymers are formed between the polymeric binder and the photopolymerized material.

The ethylenically unsaturated organic composition may also comprise or consist of unsaturated compounds having more than one carbon-to-carbon double bond, e.g. two terminal vinyl groups, or of a polymeric compound containing ethylenic unsaturation. During polymerization of these compositions usually crosslinking by means of the plurally unsaturated compound will occur. Examples of compounds containing more than one carbon-to-carbon bond are for instance divinyl benzene, diglycol diacrylates and N,N′-alkylene-bis-acrylamides. Examples of polymeric compounds containing ethylenically unsaturation are for instance allyl esters of polyacrylic acid, maleic esters of polyvinyl alcohol, polyhydrocarbons still containing carbon-to-carbon double bonds, unsaturated polyesters, cellulose acetomaleates, allyl cellulose, and the like.

In the photopolymerization of ethylenically unsaturated compounds with azohydroperoxides, high temperatures are not needed. The exposure, however, to strong light sources at a relatively short distance, brings about a certain heating of the mass to be polymerized, which heating exercises a favorable influence upon the polymerization rate. Indeed, the azohydroperoxides of the invention proved also to be very effective polymerization initiators at higher temperatures, even in the absence of light.

The photopolymerizable compositions which contain azo-hydroperoxides are useful in the preparation of photographic images.

These photographic polymeric images are manufactured by exposing a photopolymerizable layer to actinic light through a process transparency, e.g. a process positive or negative (consisting solely of opaque and transparent areas and where the opaque areas are of the same optical density, the so-called line or halftone negative or positive). After complete polymerization in the exposed areas whereby the polymeric layer is rendered insoluble in the solvent or solvents used for applying the photopolymerizable layer, the non-exposed areas are washed off with a solvent for the monomeric material.

Usually a polymerization inhibitor is added to the composition of the photopolymerizable layer in order to prevent thermal polymerization, and to make the materials capable of being stocked for a longer time. All known radical inhibitors may be used for this purpose, for example 2,6-di-tert. butyl-p-cresol.

The photopolymerizable composition is usually coated onto a support such as paper, cellulose triacetate films, poly(ethylene terephthalate) films, aluminum foils and the like. When this support material carrying the photopolymerizable composition is light-reflecting, there may be present, e.g. superposed on said support and adherent thereto or in the surface thereof, a layer or stratum absorptive of actinic light such as to minimize reflectance from the combined support of incident actinic light. The photographic polymeric images made in accordance with this invention can be used in all classes of printing, but are particularly useful in those wherein a distinct difference of height between printing and non-printing areas is required. The photopolymerizable compositions are also useful in the preparation of photoresists for etching, gravure, etc.; they can be used for the manufacture of planographic printing plates such as for offset printing methods, as matrices for printing matter, and as screens for "silk screen" printing such as stencils. The compositions can be coated onto printing cylinders, e.g. plastic or metal cylinders.

The photopolymerizable layer may vary from liquid to solid composition, it may even be in gel form.

The solvent liquid used for washing or "developing" the printing plates made from photopolymerizable compositions must be selected with care, since it should have good solvent action on the unexposed monomeric material, yet have little action on the hardened image or upon the base material, the non-halation layer, or the anchor layer with which the photopolymerizable composition may be anchored to the support.

The photopolymerizable compositions are suitable for other purposes in addition to the printing uses described above, e.g. as ornamental plaques or for producing ornamental effects; as patterns for automatic engraving machines, foundry molds, cutting and stamping dies, name stamps; relief maps for braille; as rapid cure coatings, e.g. on film base; as variable area and variable density sound trcks on film; for embossing plates, paper, e.g. with a die prepared from the photopolymerizable compositions; in the preparation of printed circuits; and in preparation of other plastic articles.

The photopolymerization initiators of the invention can be used as an ultraviolet curing catalyst for systems where low heat is a requirement in the curing of a particular part, and sun light or other source of ultraviolet light are readily available. Unsaturated polyester coated bridge or other surfaces, roofs and other outdoor coating applications are areas where the azohydroperoxides of the invention can be advantageously employed.

The following examples illustrate the present invention.

*Examples 1–6.*—In a Pyrex tube 1 g. acrylamide is dissolved in 10 ccs. of methanol whereupon $1\times10^{-4}$ mol of initiator is added. The solution is illuminated by means of a 80 watt Philips mercury-vapor lamp placed at a distance of 15 cm. The following results are obtained:

| Ex. | Initiator | Amount in mg. | Inhibition period (min.) |
|---|---|---|---|
| 1 | p-Methoxybenzyl azo-p-tolylhydroperoxide. | 27.2 | 7 |
| 2 | p-Methoxybenzyl azophenylhydroperoxide. | 25.8 | 8 |
| 3 | 1,3-diphenylpropane-2-azophenyl-2-hydroperoxide. | 33.2 | 6 |
| 4 | Cyclohexane-1-azophenylhydroperoxide | 24.0 | 1 |
| 5 | Benzylazo-p-naphthylhydroperoxide | 27.8 | 11 |
| 6 | p-Hydroxybenzyl azophenylhydroperoxide. | 24.5 | 18 |

*Examples 7–10.*—In a Pyrex tube 1 g. of monomer and 0.025 g. of p-methoxy-benzyl azophenyl hydroperoxide are dissolved in 10 ccs. of methanol. The solution is illuminated by means of a 80 watt Philips mercury-vapor lamp placed at a distance of 15 cm. The following results are obtained:

| Ex. | Monomer | Inhibition period (min.) | Yield after inhibition period +1 hour (Percent) |
|---|---|---|---|
| 7 | Acrylamide | 8 | 70 |
| 8 | Triethyleneglycol diacrylate | 8 | 24 |
| 9 | Divinyl benzene | 17 | 3 |
| 10 | Methyl methacrylate | 30 | 1 |
| 10(a) (1) | Methyl methacrylate | 30 | 25 |

[1] Under nitrogen.

*Example 11.*—0.5 g. of poly(vinyl butyral) and 1 g. of acrylamide are dissolved in 15 ccs, of acetone whereupon 0.05 g. of p-methoxybenzyl azophenylhydroperoxide is added. From this solution a film is coated in the dark onto an aluminum foil. After evaporating the acetone the film has a thickness of 10 micron and adheres very well to the aluminum foil after drying. A process transparency is laid upon the film and the whole is exposed by means of a 80 watt Philips mercury-vapor lamp placed at a distance of 5 cm. The non-exposed and thus non-polymerized areas are washed away with acetone. A relief image is obtained after an exposure time of 10 sec.

*Examples 12–16.*—According to the method of Example 11 a series of polymerizations is carried out whereby the amounts of poly (vinyl acetate), acrylamide and p-methoxylbenzylazophenylhydroperoxide vary. The results are listed in the following table:

| Example | Amount of poly (vinyl acetate) in g. | Amount of acrylamide in g. | Initiator in g. | The necessary exposure time in seconds |
|---|---|---|---|---|
| 12 | 0.5 | 0.5 | 0.05 | 15 |
| 13 | 0.5 | 1 | 0.01 | 15 |
| 14 | 0.5 | 1 | 0.05 | 10 |
| 15 | 0.5 | 1 | 0.002 | 30 |
| 16 | 1 | 0.5 | 0.05 | 15 |

*Example 17.*—0.5 g. of poly(vinyl butyral) and 0.5 g. of acrylamide are dissolved in 15 ccs. of methanol. Then 0.05 g. of p-methoxybenzyl azophenylhydroperoxide is added. From this solution a film is coated in the dark onto an aluminum foil in such a way that after drying a layer is obtained the thickness of which is 10 micron. The photopolymerizable material is stored in the dark. The material is exposed by means of a 80 watt Philips mercury-vapor lamp placed at a distance of 5 cm. through a process transparency which is laid upon the photopolymerizable layer. An exposure time of 45 sec. suffices for obtaining, after development with methanol, a good relief image.

*Example 18.*—0.5 g. of copoly(vinyl acetate/N-vinyl pyrrolidone) (1:1), 1 g. of acrylamide and 0.05 g. of N,N'-methylene bisacrylamide are dissolved in 15 ccs. of acetone, whereupon 0.002 g. of p-methoxylbenzyl azophenylhydroperoxide is added. From this solution a layer is coated in the dark onto an aluminum foil in such a way that after drying the layer has a thickness of 10 micron. After drying the layer is exposed through a process transparency by means of a 80 watt Philips mercury-vapor lamp placed at a distance of 5 cm. An exposure time of 15 sec. suffices for obtaining a good relief image after development with acetone.

*Example 19.*—1 g of copoly(vinyl acetate/N-vinyl pyrrolidone) (1:1) is dissolved in 15 ccs. of acetone. To this solution 0.5 cc. of a 60% aqueous solution of N-methylol acrylamide and 0.05 g. of p-methoxybenzyl azophenylhydroperoxide are added. This solution is coated in the drak onto an aluminum foil in such a way that after drying a film is obtained, the thickness of which is 10 micron. This film is exposed for 45 sec. through a process transparency by means of a 80 watt Philips mercury-vapor lamp placed at a distance of 5 cm. After development with acetone a good relief image is obtained.

*Example 20.*—0.5 g. of poly(vinyl acetate) and 1 g. of acrylamide are dissolved in 15 ccs. of acetone whereupon 0.005 g. of 2,6-di-tert. butyl-p-cresol and 0.05 g. of benzyl azo-β-naphthyl hydroperoxide are added. This solution is coated onto an aluminum foil in the dark in such a way that after drying a film is obtained the thickness of which is 10 micron. This film is exposed through a process transparency for 3 min. by means of a 80 watt Philips mercury-vapor lamp placed at a distance of 5 cm. After development in acetone a good relief image is obtained.

*Examples 21–24.*—In a pressure tube 2 ccs. of monomer and 0.025 g. of p-methoxybenzyl azophenylhydroperoxide are placed. Thereupon pure nitrogen is introduced for 15 min. and the tube is sealed. Then the tube is heated in the dark for 20 hours at 70° C. The results are listed in the following table:

| Ex. | Monomer | Results |
|---|---|---|
| 21 | Styrene | Thick viscous product. |
| 22 | Methyl methacrylate | Solid product. |
| 23 | Triethyleneglycol diacrylate | Becomes rapidly solid. |
| 24 | Acrylamide (1 g. in 5 ccs. of cyclohexanone). | Do. |

We claim:

1. Process for the photopolymerization of ethylenically unsaturated organic compositions, which comprises exposing said ethylenically unsaturated organic composition to actinic light rays in the presence as a photopolymerization initiator of at least one pre-formed azohydroperoxide.

2. A process as set forth in claim 1, wherein the azohydroperoxide corresponds to the formula:

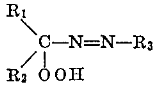

wherein each of $R_1$, $R_2$ and $R_3$ represents any organic radical which is inert to azo and hydroperoxide radicals.

3. A process as set forth in claim 1, wherein the azohydroperoxide corresponds to the formula:

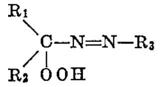

wherein:

$R_1$ is a member of the group consisting of hydrogen, alkyl, aryl, aralkyl, alkaryl, alkoxy, aryloxy, hydroxyalkyl, hydroxyaryl, carboxyalkyl and derivatives, carboxyaryl and derivatives, sulfoalkyl and derivatives, sulfoaryl and derivatives and halogen;

$R_2$ is a member of the group consisting of hydrogen, alkyl, aralkyl, alkoxy, arloxy, hydroxyalkyl, carboxyalkyl and derivatives, sulfoalkyl and derivatives, and halogen;

with the provision that $R_1$ and $R_2$ may also be linked and form together a radical selected from cycloaliphatic and heterocyclic radicals;

and wherein $R_3$ is a member of the group consisting of hydrogen, alkyl, aryl, alkaryl, aralkyl, with the provision that alkyl, aryl, alkaryl and aralkyl may also be substituted by at least one of the radicals selected from —OH, —COOH and derivatives, —$SO_3H$ and derivatives, halogen, —$NO_2$ and alkoxy.

4. A process as set forth in claim 2, wherein the azohydroperoxide is a bis(azohydroperoxide).

5. A process as set forth in claim 1, wherein the azohydroperoxide is a polymeric azohydroperoxide.

6. A process as set forth in claim 5, wherein the polymeric azohydroperoxide is obtained by the reaction of hydrazine with a polymer selected from polymeric ketones and polymeric aldehydes, followed by oxidation.

7. A process as set forth in claim 1, wherein the ethylenically unsaturated organic compositions comprises at least one ethylenically unsaturated polymerizable compound mixed with a polymeric binding agent.

8. A process as set forth in claim 1, wherein the ethylenically unsaturated composition comprises at least one unsaturated compound having more than one carbon-to-carbon double bond.

9. A process as set forth in claim 1, wherein the ethylenically unsaturated composition comprises a polymeric compound containing ethylenically unsaturation.

10. A process as set forth in claim 1, wherein the azohydroperoxide is used in an amount between 0.01 and 5% by weight based upon the amount of photopolymerizable material present.

11. A process as set forth in claim 1, wherein the ethylenically unsaturated composition is polymerized in solution.

12. A process as set forth in claim 1, wherein the ethlenically unsaturated composition is applied as a coating on a support.

13. A process as set forth in claim 1, wherein the ethylenically unsaturated composition is present in the crystalline state.

14. A process for producing a polymeric photographic image, which comprises exposing to actinic light rays through a process transparency a photographic element comprising a support having thereon a light-sensitive layer comprising an ethylenically unsaturated organic composition and as photopolymerization initiator at least one pre-formed azohydroperoxide, whereby in the exposed areas said ethylenically unsaturated organic composition is polymerized to an insoluble state, and removing the layer in the non-exposed areas.

15. A photopolymerizable element comprising a support and superposed thereon a light-sensitive layer comprising an ethylenically unsaturated organic composition and as photopolymerization initiator at least one preformed azohydroperoxide.

16. A photopolymerizable element as set forth in claim 15, wherein the support is selected from paper, cellulose triacetate films, poly(ethylene terephthalate) films and aluminum foils.

17. A photopolymerizable element as set forth in claim 15, wherein the support includes a layer which is capable of absorbing actinic light.

References Cited by the Examiner

UNITED STATES PATENTS 2,601,293 6/1952 Howard ______________ 260—80

OTHER REFERENCES

Pausacker, J. Chem. Soc., 1950 (pp. 3478–81).

J. TRAVIS BROWN, *Acting Primary Examiner.*

NORMAN G. TORCHIN, *Examiner.*

T. J. HOFFMANN, R. H. SMITH, *Assistant Examiners.*